United States Patent
Lee et al.

(10) Patent No.: US 9,831,023 B2
(45) Date of Patent: *Nov. 28, 2017

(54) ELECTRODE STRUCTURE AND THE CORRESPONDING ELECTRICAL COMPONENT USING THE SAME AND THE FABRICATION METHOD THEREOF

(71) Applicant: CYNTEC CO., LTD., Hsinchu (TW)

(72) Inventors: Chi-Hsun Lee, Taipei (TW); Hsieh-Shen Hsieh, Changhua County (TW); Sen-Huei Chen, Yunlin County (TW)

(73) Assignee: CYNTEC CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/791,494

(22) Filed: Jul. 6, 2015

(65) Prior Publication Data
US 2016/0012962 A1    Jan. 14, 2016

Related U.S. Application Data

(60) Provisional application No. 62/023,174, filed on Jul. 10, 2014.

(51) Int. Cl.
*H01F 27/02* (2006.01)
*H01F 27/29* (2006.01)
*H01F 27/24* (2006.01)
*H01F 17/04* (2006.01)
*H01L 23/00* (2006.01)
*H01F 3/10* (2006.01)

(52) U.S. Cl.
CPC ......... *H01F 17/045* (2013.01); *H01F 27/022* (2013.01); *H01F 27/292* (2013.01); *H01L 24/00* (2013.01); *H01F 3/10* (2013.01); *H01F 2017/048* (2013.01)

(58) Field of Classification Search
CPC .... H01F 17/045; H01F 27/022; H01F 27/292; H01L 24/00
USPC ............................. 336/83, 192, 90, 221, 233
See application file for complete search history.

(56) References Cited

U.S. PATENT DOCUMENTS

| | | | | |
|---|---|---|---|---|
| 4,498,067 A | * | 2/1985 | Kumokawa | H01F 5/00 336/192 |
| 2003/0048167 A1 | * | 3/2003 | Inoue | H01F 17/0013 336/200 |

(Continued)

*Primary Examiner* — Tsz Chan
*Assistant Examiner* — Kazi Hossain
(74) *Attorney, Agent, or Firm* — Min-Lee Teng; Litron Patent & Trademark Office

(57) ABSTRACT

An electrical component is disclosed, wherein the electrical component comprises: a body; a conductive element disposed in the body, wherein at least one portion of a terminal part of the conductive element is exposed outside of the body; a metal foil having an adhesive material on the bottom surface thereof, the metal foil being adhered on the body through the adhesive material and covering a first portion of the terminal part of the conductive element, wherein a second portion of the terminal part of the conductive element is not covered by the metal foil; and a metal layer, overlaying on the metal foil and covering the second portion of the terminal part of the conductive element, wherein the metal layer is electrically connected to the second portion of the terminal part of the conductive element for electrically connecting with an external circuit.

12 Claims, 9 Drawing Sheets

(56) References Cited

U.S. PATENT DOCUMENTS

| | | | | |
|---|---|---|---|---|
| 2007/0159282 A1* | 7/2007 | Huang | .................. | H01F 27/255 336/83 |
| 2009/0085703 A1* | 4/2009 | Liu | ........................ | H01F 17/04 336/192 |
| 2009/0128275 A1* | 5/2009 | Yagasaki | ................. | H01F 17/04 336/83 |
| 2009/0231077 A1* | 9/2009 | Liao | ........................ | H01F 3/10 336/177 |
| 2010/0007453 A1* | 1/2010 | Yan | ...................... | H01F 27/027 336/90 |
| 2010/0277267 A1* | 11/2010 | Bogert | ..................... | H01F 3/10 336/221 |
| 2013/0249661 A1* | 9/2013 | Motomiya | .......... | H01F 17/0013 336/200 |
| 2014/0002227 A1* | 1/2014 | Hsieh | .................. | H01F 27/022 336/200 |

* cited by examiner

ELECTRODE STRUCTURE AND THE CORRESPONDING ELECTRICAL COMPONENT USING THE SAME AND THE FABRICATION METHOD THEREOF

CROSS-REFERENCES TO RELATED APPLICATIONS

This application claims the benefit of U.S. Provisional Patent Application No. 62/023,174 filed on Jul. 10, 2014, which is hereby incorporated by reference herein and made a part of specification.

BACKGROUND OF THE INVENTION

I. Field of the Invention the present invention relates to an electrical component, and in particularly, to the electrodes of the electrical component.

II. Description of the Prior Art

As an electrical component or an electronic device becomes smaller and smaller, the size and the reliability of the electrode structure becomes a bottleneck considering the electrical performance and the reliability of the electrical component. The electrodes are used to connect the electrical component to an external circuit such as a printed circuit board (PCB), and terminals of the conductive elements of the electrical component are electrically connected to corresponding electrodes such as surface-mount pads for soldering onto the corresponding pads on the PCB. A lead frame is usually welded to the terminals of the electrical component; however, the size of the lead frame normally takes quite a large space for an electrical component in a small foot print and therefore, the lead frame is not suitable for being used as an electrode for certain electrical components or electronic devices that requires a smaller size.

Surface Mount Technology (SMT) is a feasible way to reduce the overall size of an electrical component or an electronic device, such as a resistor, a capacitor or an inductor. However, as the overall size of the electrical component becomes smaller and smaller, how to make the surface-mount pads reliable in both mechanic and electrical aspects is a very important topic. The electrode created by conventional electroplating on an Ag glue layer which is susceptible to the changes of temperature or moisture, which degrades electrical performance and mechanical strength a lot in certain applications or even affect the yield rate of the electrical components in manufacturing factory. On the other hand, chemical plating can cause a short circuit when the material of the plating spreads into certain unwanted areas.

Accordingly, the present invention proposes an electrode structure to overcome the above-mentioned problems.

SUMMARY OF THE INVENTION

One objective of the present invention is to provide an electrode structure for connecting to an external circuit with improved electrical performance and mechanical strength of the electrode structure.

In one embodiment, an electrical component is disclosed, the electrical component comprising: a body; a conductive element disposed in the body, wherein at least one portion of a terminal part of the conductive element is exposed outside of the body; a metal foil having an adhesive material on the bottom surface thereof, the metal foil being adhered on the body through the adhesive material and covering a first portion of the terminal part of the conductive element, wherein a second portion of the terminal part of the conductive element is not covered by the metal foil; and a metal layer, overlaying on the metal foil and covering the second portion of the terminal part of the conductive element, wherein the metal layer is electrically connected to the second portion of the terminal part of the conductive element for electrically connecting with an external circuit.

In one embodiment, the metal foil is a resin coated copper foil.

In one embodiment, the metal foil is made of Cu.

In one embodiment, the metal layer is made of Sn.

In one embodiment, the metal layer is made by electroplating.

In one embodiment, the metal foil is adhered on the first portion and a third portion of the terminal part of the conductive element, wherein the second portion is located between the first portion and the third portion.

In one embodiment, a third portion of the terminal part of the conductive element is not covered by the metal foil, wherein the first portion of the terminal part of the conductive element is located between the second portion and the third portion of the terminal part of the conductive element.

In one embodiment, a recess is formed on the top surface of the body, wherein the terminal part of the conductive element is disposed in the recess.

In one embodiment, the electrical component is an inductor and the conductive element is a coil, and the coil is disposed in the body with the terminal part of the coil disposed in a recess on a surface of the body.

In one embodiment, the electrical component is an inductor and the conductive element is a coil, wherein the body is a magnetic body and the coil is disposed in the magnetic body with the terminal part of the coil disposed in a recess on the bottom surface of the body, wherein the magnetic body comprises a T-core having a pillar, wherein the coil surrounds the pillar and the terminal part of the coil disposed in the recess on the bottom surface of the magnetic body via a side surface of the T-core.

In one embodiment, an inductor is disclosed, the inductor comprising: a magnetic body; a coil, disposed in the magnetic body, wherein at least one portion of a terminal part of the coil is exposed outside of the magnetic body; a metal foil, being adhered on the magnetic body and covering a first portion of the terminal part of the coil, wherein a second portion of the terminal part of the coil is not covered by the metal foil; and a metal layer, overlaying on the metal foil and covering the second portion of the terminal part of the coil, wherein the metal layer is electrically connected to the second portion of the terminal part of the coil for electrically connecting with an external circuit.

In one embodiment, the magnetic body comprises a T-core having a pillar, wherein the coil surrounds the pillar and the terminal part of the coil disposed in a first recess on the bottom surface of the magnetic body via a side surface of the T-core.

In one embodiment, a method to make an electrical component is disclosed, the method comprising: proving a body, wherein a conductive element disposed in the body, wherein at least one portion of a first terminal part of the conductive element is exposed outside of the body; and disposing a first metal layer on the body by using a PVD process, wherein the first metal layer covers the at least one portion of the first terminal part of the conductive element.

In one embodiment, in the method described above, at least one portion of a second terminal part of the conductive element is exposed outside of the body, the method further comprising disposing a second metal layer on the body by using the PVD process, wherein the second metal layer covers the at least one portion of the second terminal part of the conductive element.

In one embodiment, in the method described above, the electrical component is an inductor, wherein the body is a magnetic body and the conductive element is a coil, wherein the coil is disposed in the magnetic body with the terminal part of the coil disposed in a recess on a surface of the body.

In one embodiment, in the method described above, the electrical component is an inductor, wherein the body is a magnetic body and the conductive element is a coil, wherein coil is disposed in the magnetic body with the terminal part of the coil disposed in a recess on the bottom surface of the body, wherein the magnetic body comprises a T-core having a pillar, wherein the coil surrounds the pillar and the terminal part of the coil disposed in the recess on the bottom surface of the magnetic body via a side surface of the T-core.

In one embodiment, an electrical component is disclosed, the electrical component comprising: a body; a conductor wire disposed in the body, wherein a first axial surface of a first end of the conductor wire and a second axial surface of a second end of the conductor wire are exposed outside of the body, wherein the first axial surface and the second axial surface are exposed on a same surface or two opposite surfaces of the body; a first electrode structure disposed on the body and electrically connected to the first axial surface of the first end of the conductor wire; and a second electrode structure disposed on the body and electrically connected to the second axial surface of the second end of the conductor wire.

In one embodiment, the electrical component further comprising a protecting layer covering the outer surfaces of the body without covering the first axial surface of the first end of the conductor wire and the second axial surface of the second end of the conductor wire.

In one embodiment, the electrical component is an inductor, wherein the body is a magnetic body and the conductive wire is a coil, wherein the coil is disposed in the magnetic body.

In one embodiment, the electrical component is an inductor and the conductive wire is a coil, wherein the body is a magnetic body and the coil is disposed in the magnetic body with the terminal part of the coil disposed in a recess on the bottom surface of the body, wherein the magnetic body comprises a T-core having a pillar, wherein the coil surrounds the pillar and the terminal part of the coil disposed in the recess on the bottom surface of the magnetic body via a side surface of the T-core.

The detailed technology and above preferred embodiments implemented for the present invention are described in the following paragraphs accompanying the appended drawings for people skilled in this field to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF THE INVENTION

The detailed explanation of the present invention is described as following. The described preferred embodiments are presented for purposes of illustrations and description, and they are not intended to limit the scope of the present invention.

Figure 1:
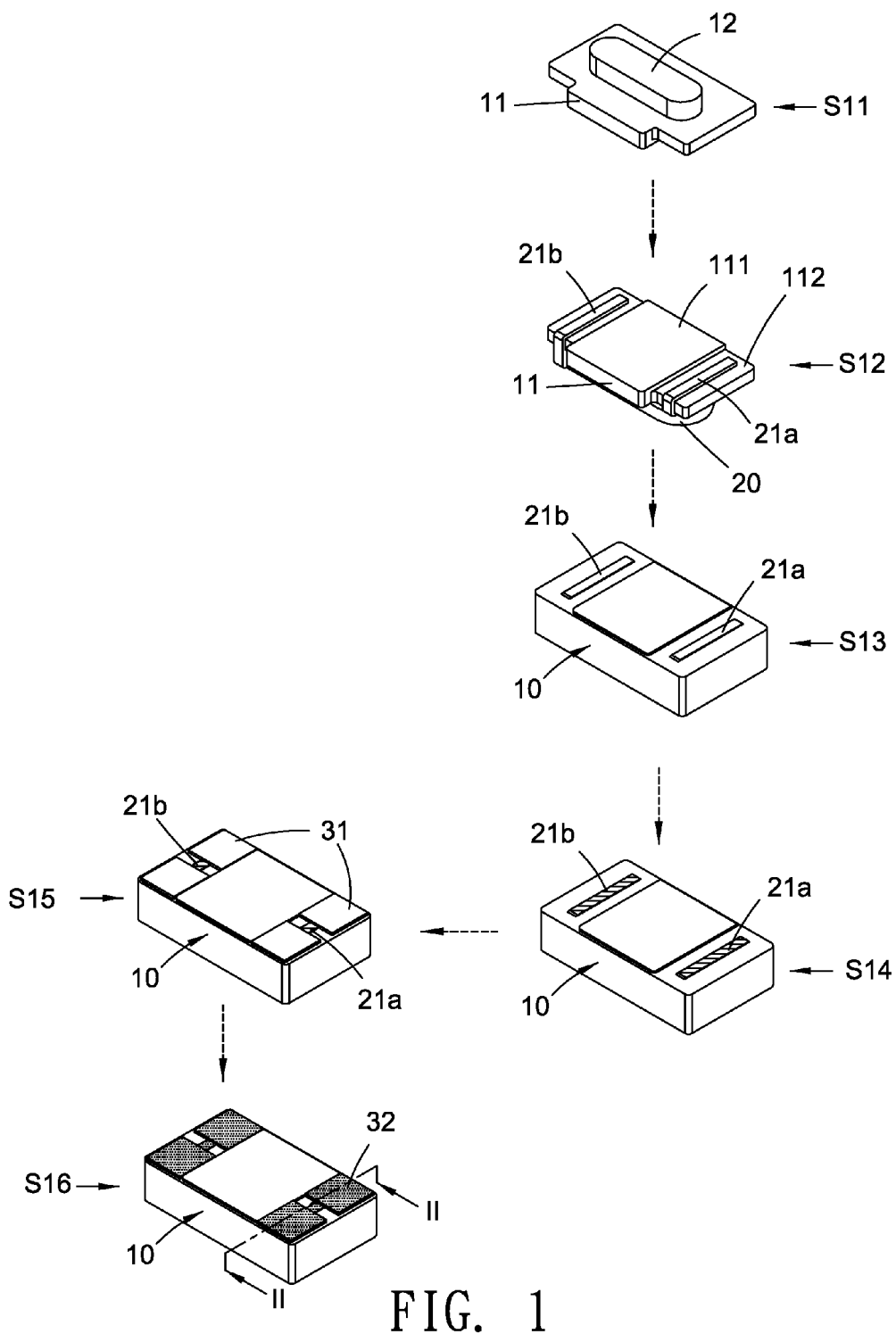
FIG. 1 illustrate an electrical component according to one embodiment of the present invention.
Figure 2:
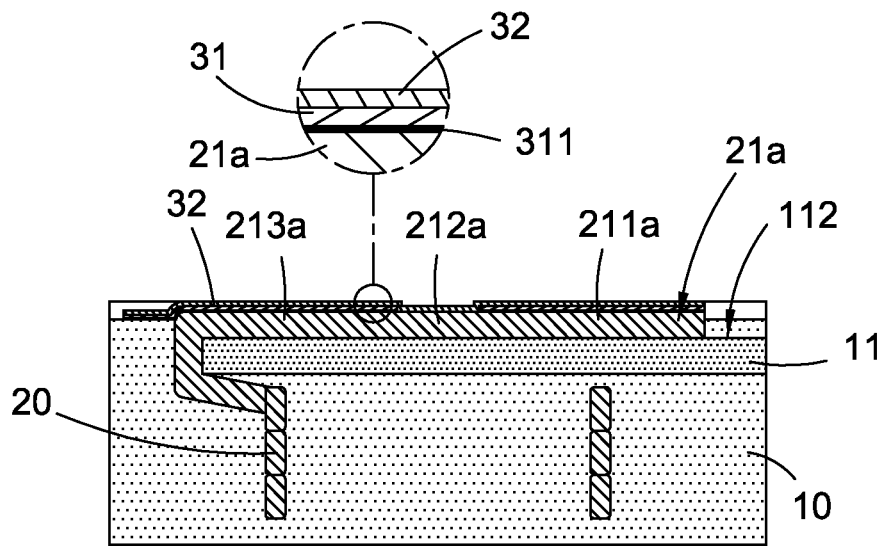
FIG. 2 illustrate a cross-sectional view of the II-II portion of FIG. 1 in one embodiment.

Please refer to FIG. 1 and FIG. 2, which illustrates an electrode structure of an electrical component according to an embodiment of the present invention. The electrode structure can be used to electrically connect terminals of conductive elements of the electrical component with an external circuit such as a printed circuit board (PCB). In one embodiment, the electrical component comprises: a main body 10 and a conductive element 20 disposed in the main body 10, wherein the conductive element 20 has two terminal parts 21a, 21b and at least one portion of each of the terminal part 21a, 21b is exposed outside of the main body 10; a metal foil 31 having an adhesive material 311 on the bottom surface thereof (please refer to FIG. 2), wherein the metal foil 31 is adhered to the main body 10 through the adhesive material 311 and covers a first portion 211a and a third portion 213a of the terminal part 21a, wherein a second portion 212a of the terminal part 21a of the conductive element are not overlaid by the metal foil 31; a first metal layer 32, overlaying on the metal foil 31 and the second portion 212a of the terminal part 21a, wherein the first metal layer 32 is electrically connected to the second portion 212a of the terminal part 21a of the conductive element 20 to form a first electrode structure for electrically connecting with an external circuit. Likewise, a second electrode structure that is the same as the first electrode structure can be formed on the terminal part 21b, which will not be described further.

Figure 3:
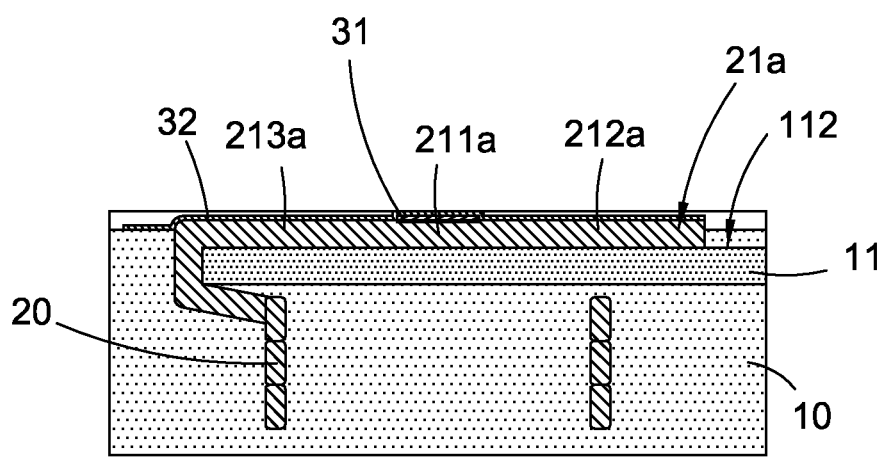
FIG. 3 illustrates a cross-sectional view of the II-II portion of FIG. 1 in another embodiment.

Please refer to FIG. 3, which illustrates a cross-sectional view of an electrode structure of an electrical component according to an embodiment of the present invention, wherein the metal foil 31 is adhered to the main body 10 through the adhesive material 311 and covers the first portion 211a of the terminal part 21a of the conductive element 20, wherein the second portion 212a and a third portion 213a of the terminal part 21a of the conductive element 20 are not overlaid by the metal foil 31; a first metal layer 32, overlaying on the metal foil 31 and the second portion 212a and a third portion 213a of the terminal part 21a of the conductive element 20, wherein the first metal layer 32 is electrically connected to the second portion 212a and the third portion 213a of the terminal part 21a of the conductive element 20 to form a first electrode structure for electrically connecting with an external circuit. Likewise, a second electrode structure that is the same as the first electrode structure can be formed on the terminal part 21b, which will not be described further.

In one embodiment, the adhesive material 311 comprises polymer material mixed with conductive material, such as Ag powder mixed with epoxy resin. The conductive material is not limited to the Ag powder, it can be Cu powder or any other suitable conductive metal or alloy. In one embodiment, the first metal layer comprises Sn. In one embodiment, the adhesive material 311 comprises resin or resin mixed with conductive material.

In one embodiment, the metal foil 31 is made of Cu. In one embodiment, the metal foil 31 is a Resin Coated Copper (RCC). That is, there can be two conductive paths formed between the first metal layer 32 and the terminal parts 21a, wherein a first conductive path is formed from the terminal parts 21a to the first metal layer 32, and a second conductive path is formed from the terminal parts 21a to the first metal layer 32 via the metal foil 31.

Please note that the shape of the metal foil 31 and the position of the metal foil 31 on the main body 10 relative to the terminal parts 21a, 21b can be in any suitable pattern, not limited to the examples shown in FIG. 2 and FIG. 3.

In one embodiment, the first metal layer 32 overlays on the metal foil 31 through a thick film process such as electroplating.

As shown in FIG. 1, the steps of manufacturing an inductor based on a T-core comprises: providing a T-core 11 having a pillar 12 (step S11); providing a conductive element 20 and winding the conductive element 20, such as a spiral coil, on the pillar 12 (step S12), wherein each of the two terminal parts 21a, 21b of the conductive element 20 is bent onto a recess 112 on the top surface 111 of the T-core 11, wherein the shape of the conductive element 20 can be round or flat wire; placing the conductive element 20 and the T-core 11 in a molding device, then filling magnetic powder material into the molding device, and then applying a hot pressing process on the magnetic powder material encapsulating the conductive element 20 and the T-core 11 to form the magnetic body 10 (step S13); removing the insulating material encapsulating the terminal parts 21a, 21b of the conductive element 20 so as to expose the terminal parts 21a, 21b (step S14), wherein, for example, the conductive element 20 is an enameled wire and the insulating material of the enameled wire encapsulating the internal conductor can be removed by laser; adhering the metal foil 31 onto the magnetic body; and overlaying the first metal layer 32 on the metal foil 31 and the second portion 212a of the terminal part 21a of the conductive element 20 for electrically connecting with an external circuit. In one embodiment, the first metal layer 32 can be Sn or Ni or any suitable metal or alloy. In one embodiment, the shape of the enameled wire can be round or flat or other suitable shape.

Figure 4:
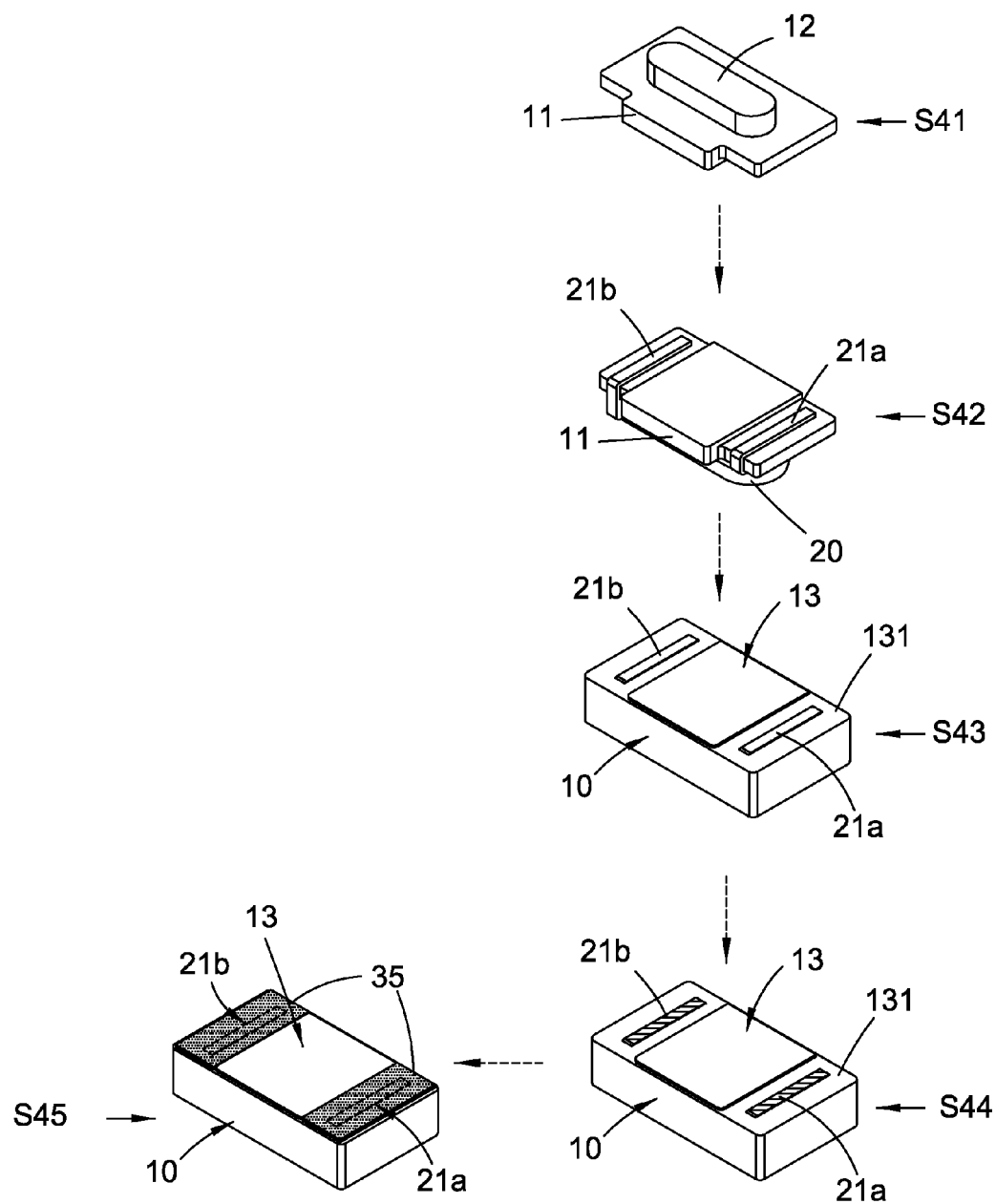
FIG. 4 illustrate a manufacturing process to make the electrical component according to one embodiment of the present invention.

As shown in FIG. 4, the steps of manufacturing an inductor based on a T-core comprises: providing a T-core 11 having a pillar 12 (step S41); providing a conductive element 20 and winding the conductive element 20, such as a spiral coil, on the pillar 12 (step S42), wherein each of the two terminal parts 21a, 21b of the conductive element 20 is bent onto a recess 131 on the bottom surface 13 of the magnetic body 10, wherein the shape of the conductive element 20 can be round or flat wire; placing the conductive element 20 and the T-core 11 in a molding device, then filling magnetic powder material into the molding device, and then applying a hot pressing process on the magnetic powder material encapsulating the conductive element 20 and the T-core 11 to form the magnetic body 10 (step S43); removing the insulating material encapsulating the terminal parts 21a, 21b of the conductive element 20 so as to expose the terminal parts 21a, 21b (step S44), wherein, for example, the conductive element 20 is an enameled wire and the insulating material of the enameled wire encapsulating the internal conductor can be removed by laser; performing a PVD (Physical Vapor Deposition) process to form a metal layer 35 on the magnetic body 10 to encapsulate the terminal parts 21a, 21b (step S45). In one embodiment, the metal layer 35 can be Sn or Ni or any suitable metal or alloy. In one embodiment, the shape of the enameled wire can be round or flat or other suitable shape.

Figure 5:
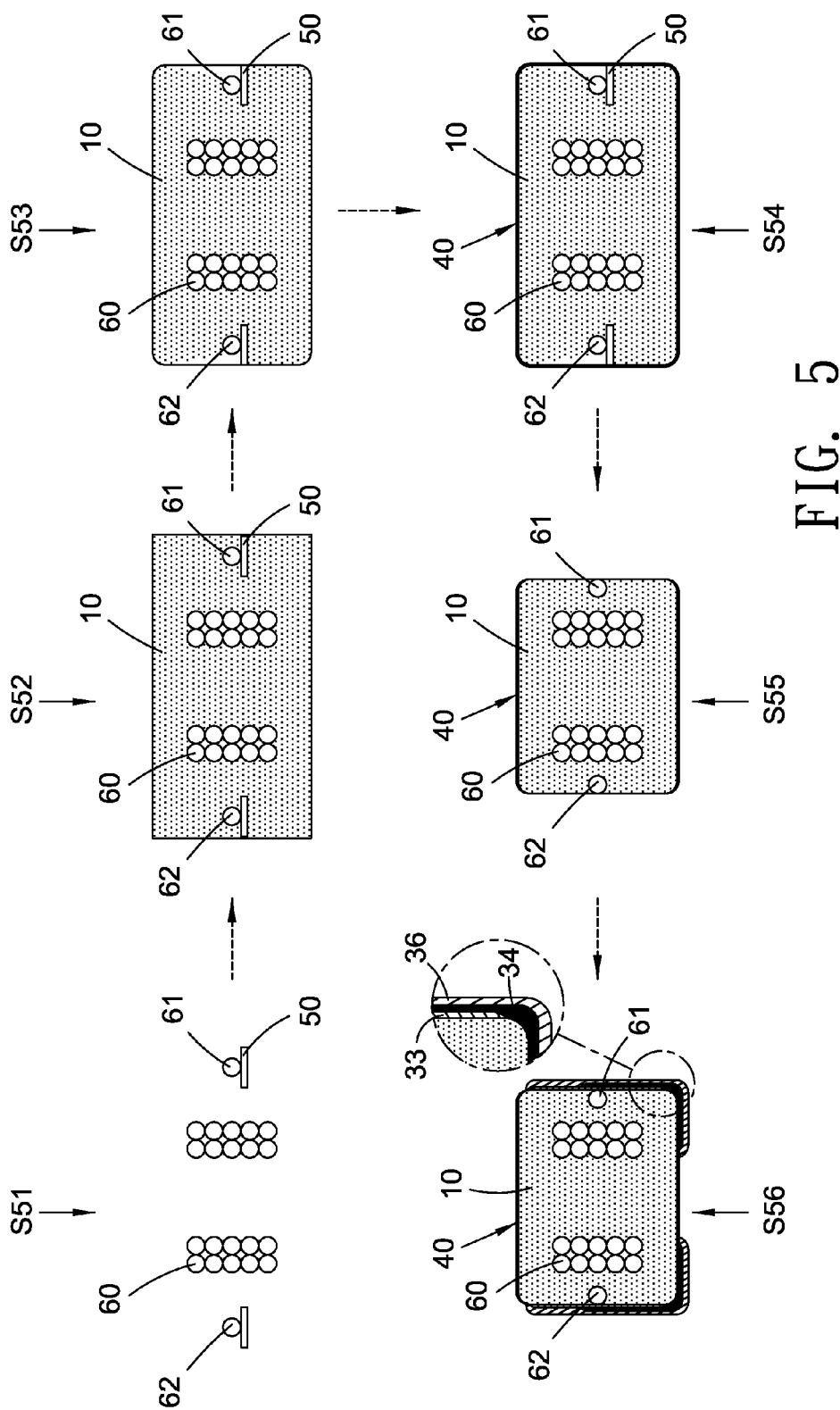
FIG. 5 illustrate a manufacturing process to make the electrical component according to another embodiment of the present invention.
Figure 6:
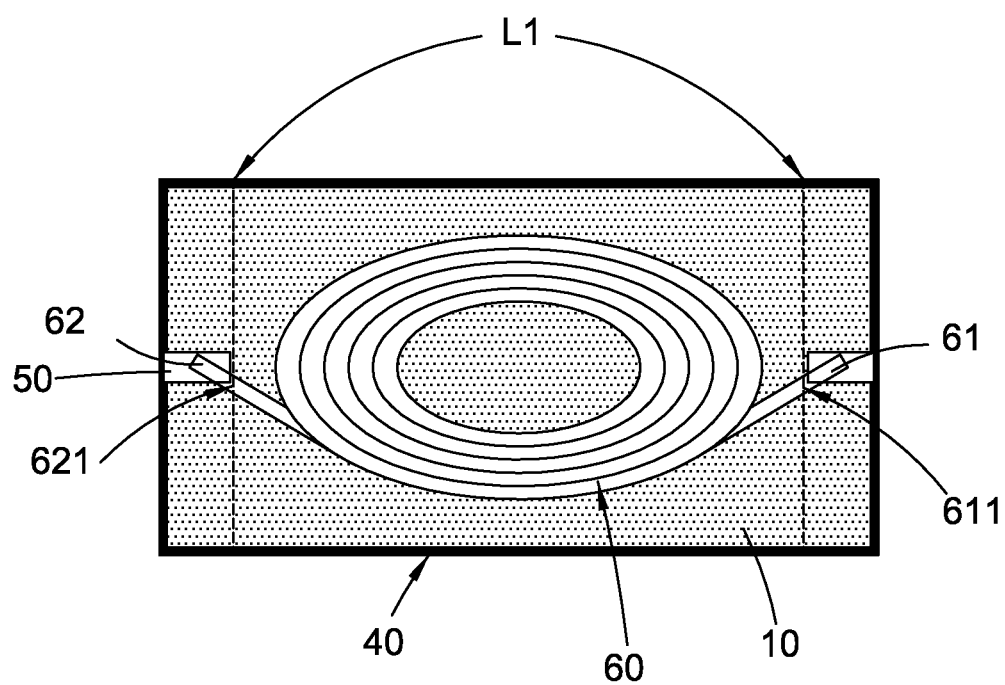
FIG. 6 illustrate a cross-sectional view of the electrical component of FIG. 5 according to one embodiment of the present invention.

Please refer to FIG. 5 and FIG. 6, which shows a structure of an inductor and the manufacturing process for making the inductor such as a choke. As shown in FIG. 5, the inductor or the choke comprises: a main body 10, a conductor wire 60, a protective layer 40 and an electrode structure, wherein the conductor wires 60 is encapsulated in the main body 10 and the first axial surface 611 of the first end 61 of the conductor wire 60 and the second axial surface 621 of the second end 62 of the conductor wire 60 are exposed outside of the main body 10 (see FIG. 6), wherein a first electrode structure disposed on the main body 10 and electrically connected with the first axial surface 611 of the first end 61 of the conductor wire 60, and a second electrode structure disposed on the main body 10 and electrically connected with the second axial surface 621 of the second end 62 of the conductor wire 60. In one embodiment, a protective layer 40 is disposed on the main body 10 to cover the outer surface of the main body 10, and then an outer portion of the protective layer 40 together with a first portion of the first end 61 and a second portion of the second end 62 are removed to expose the first axial surface 611 of the first end 61 of the conductor wire 60 and the second axial surface 621 of the second end 62 of the conductor wire 60 outside the main body 10, wherein the first electrode structure disposed on the main body 10 and electrically connected with the first axial surface 611 of the first end 61 of the conductor wire 60, and the second electrode structure disposed on the main body 10 and electrically connected with the second axial surface 621 of the second end 621 of the conductor wire 60. The aforementioned electrode structure can prevent the material of the electroplating spreads into certain unwanted areas.

In one embodiment, the electronic component in FIG. 5 an inductor, wherein the conductor wire 60 can be a spiral coil, but not limited to. In one embodiment, the electrode structure, as shown in FIG. 5, comprises: a first metal layer 33, a conductive adhesive 34 (e.g. silver paste), and a second metal layer 36, wherein the first metal layer 33 are attached and electrically connected with the first axial surface 611 of the first end 61 of the conductor wire 60 and the second axial surface 621 of the second end 62 of the conductor wire 60, the conductive adhesive 34 is disposed on the main body 10, and the second metal layer 36 is overlaid on the main body 10 to cover the conductive adhesive layer 34 and a portion of the protective layer 40. In one embodiment, the conductive adhesive layer 34 is overlaid on a portion or the entire of the first metal layer 33; and in one embodiment, the conductive adhesive layer 34 is not overlaid on any portion of the first metal layer 33 at all. The purpose of the conductive adhesive 34 is to adhere the second metal layer 36 to the first metal layer 33 or the protective layer 40 firmly.

In one embodiment, a method for manufacturing the inductor, as shown in FIG. 5, comprising: providing a conductor wire 60; forming a main body 10 to encapsulate the conductor wire 60; forming a protective layer on the outer surface of the main body 10; cutting off a first portion of the magnetic body along with a first portion of the first ending part of the wire conductor 60 to expose the first axial surface 611 of the first end 61 of the wire conductor 60 and a second portion of the main body 10 along with a second portion of the second ending part of the wire conductor 60 to expose the second axial surface 621 of the second end 62 of the wire conductor 60; forming a first electrode structure on the main body 10 and electrically connected with the first axial surface 611 of the first end 61 of the conductor wire 60 and a second electrode structure on the main body 10 and electrically connected with the second axial surface 621 of the second end 62 of the conductor wire 60.

In one embodiment, the wire conductor 60 is a round or a flat wire, but not limited to. In one embodiment, the first axial surface 611 of the first end 61 of the wire conductor 60 and the second axial surface 621 of the second end 62 of the wire conductor 60 are located on a same surface of the main body 10. In one embodiment, the first axial surface 611 of the first end 61 of the wire conductor 60 and the second axial surface 621 of the second end 62 of the wire conductor 60 are located two opposite surfaces of the main body 10, as shown in FIG. 6.

In one embodiment, a manufacturing process for manufacturing the inductor, as shown in FIG. 5, comprising the steps of: providing a conductor wire 60 and a lead frame 50, wherein each end of the conductor wire 60 is fixed by the lead frame (step S51), the conductor wire 60 can be a spiral coil 60 that is made of enameled wire. The shape of the wire can be round or flat or other suitable shape; placing the conductor wire 60 and the lead frame 50 in a molding device, then filling magnetic powder material into the molding device, and then applying cold pressing process followed by hot pressing process on the magnetic powder material encapsulating the conductor wire 60 and a portion of the lead frame 50 to form the main body 10 such as an magnetic body (step S52); cutting off a portion of the main body 10 together with the lead frame and polishing the outer surfaces of the main body 10 (step S53); coating a protective layer 40 on the outer surfaces of the main body 10 (step S54); removing off the lead frame together with a portion of the ending part of the conductor wire 60 to expose the first axial surface 611 of the first ending part 61 of the wire conductor 60 and the second axial surface 621 of the second ending part 62 of the wire conductor 60, wherein the cutting line is along the line L1, as shown in FIG. 6 (step S55), wherein the ratio of the winding space of the coil relative to the size of the magnetic body can be increased; forming a first electrode structure on the main body 10 and electrically connected with the first axial surface 611 of the first end 61 of the conductor wire 60 and a second electrode structure on the main body 10 and electrically connected with the second axial surface 621 of the second end 62 of the conductor wire 60 (step S55), wherein each of the electrode structure comprises: a first metal layer 33, a conductive adhesive layer 34 (e.g. silver paste), and a second metal layer 36, wherein the first metal layer 33 are attached and electrically connected with the first axial surface 611 of the first end 61 of the conductor wire 60 and the second axial surface 621 of the second end 62 of the conductor wire 60, the conductive adhesive layer 34 is disposed on the main body 10, and the second metal layer 36 is overlaid on the main body 10 to cover the conductive adhesive layer 34 and a portion of the protective layer 40.

In one embodiment, the conductive adhesive 34 is overlaid on a portion or the entire of the first metal layer 33; and in one embodiment, the conductive adhesive layer 34 is not overlaid on any portion of the first metal layer 33 at all. The purpose of the conductive adhesive layer 34 is to adhere the second metal layer 36 to the first metal layer 33 or the protective layer 40 firmly.

In one embodiment, the first metal layer 33 is made by electroplating or CVD or PVD process. In one embodiment, the first metal layer 33 is made of Cu, Ag or other suitable metal or alloy. In one embodiment, the second metal layer 36 is made by electroplating process. In one embodiment, the second metal layer 36 is made of Sn, Ni, or other suitable metal or alloy.

Figure 7:
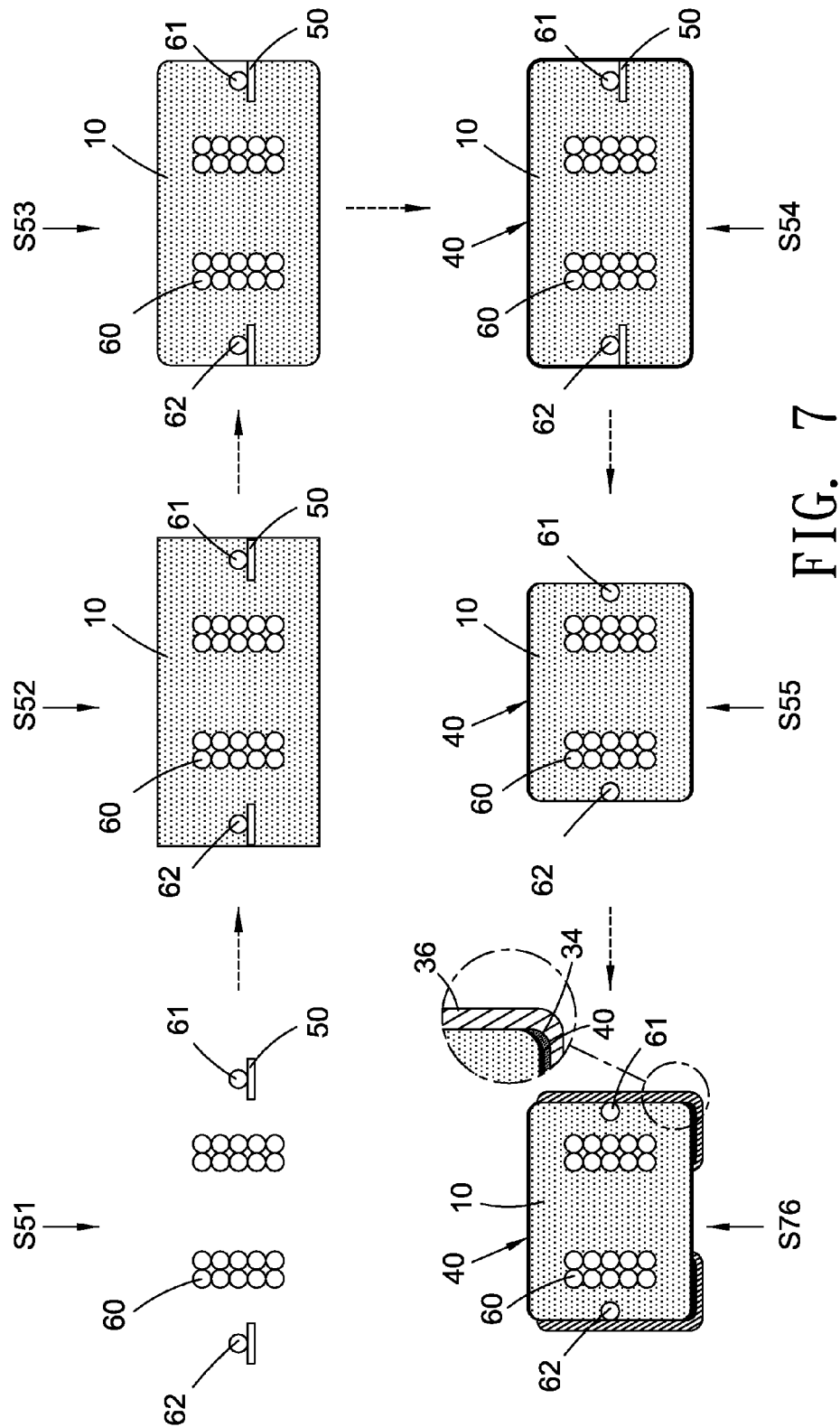
FIG. 7 illustrate a manufacturing process to make the electrical component according to another embodiment of the present invention.

Please refer to FIG. 7, which shows another manufacturing process for manufacturing the inductor. The steps of S51~S55 are the same as described above for FIG. 5 and the differences between the FIG. 7 and FIG. 5 lies in the electrode structure.

The electrode structure, as shown in S76 of the FIG. 7 comprises the conductive adhesive 34 and the second metal layer 36, wherein the second metal layer 36 overlays on the main body 10 to cover the conductive adhesive layer 34 and a portion of the protective layer 40 and electrically connects with the first axial surface 611 of the first end 61 of the conductor wire 60 and the second axial surface 621 of the second end 62 of the conductor wire 60, respectively.

In one embodiment, the conductive adhesive layer 34 is adhered on the protective layer 40 on the bottom surface of the main body 10 for adhering the second metal layer 36 to the protective layer 40 on the bottom surface of the main body 10. In one embodiment, the second metal layer 36 is in a shape of L (as shown in S56 of FIG. 5).

Figure 8:
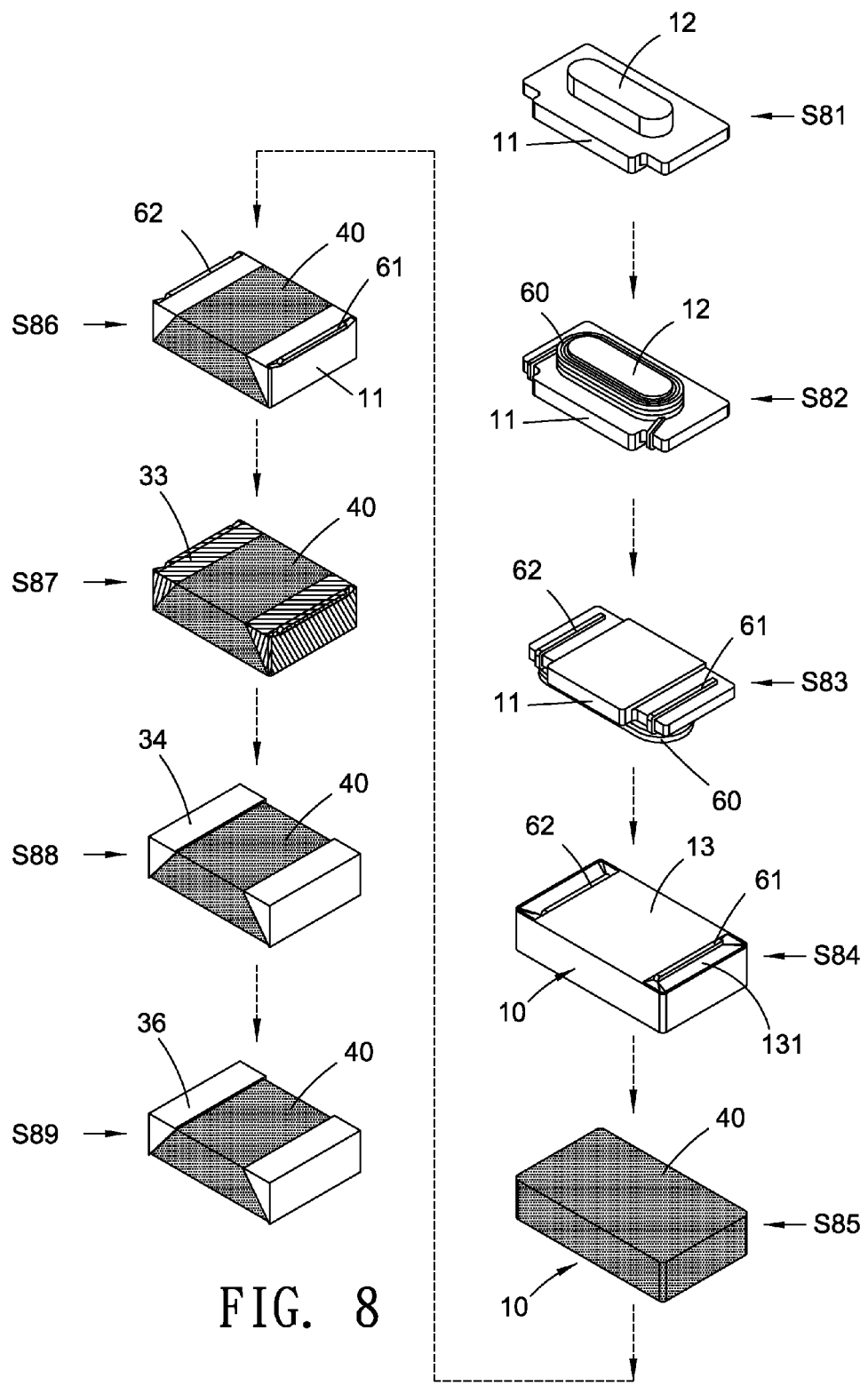
FIG. 8 illustrate a manufacturing process to make the electrical component according to another embodiment of the present invention.
Figure 9:
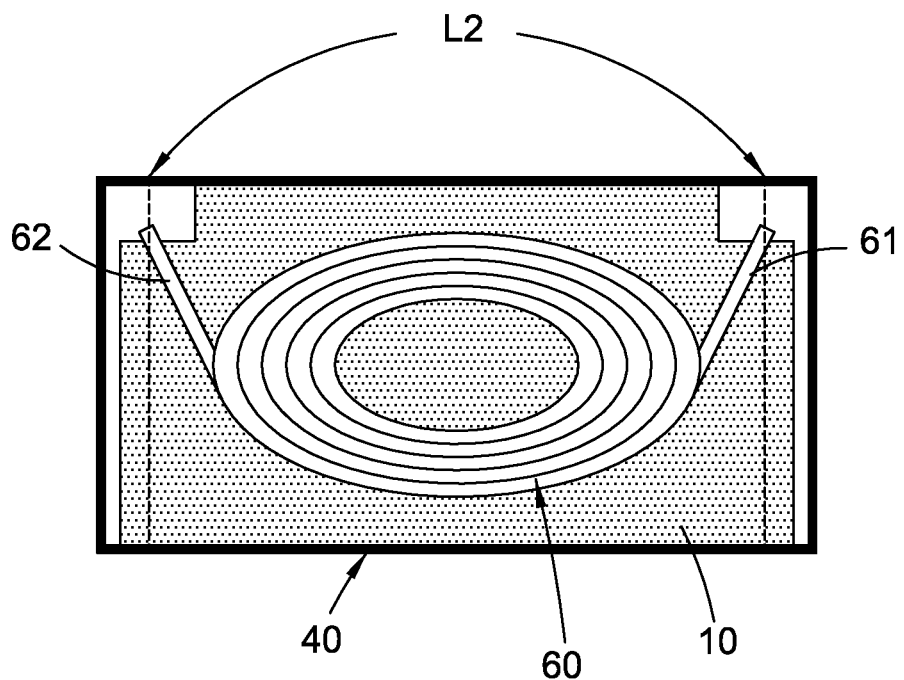
FIG. 9 illustrate a cross-sectional view of the electrical component of FIG. 8 according to one embodiment of the present invention.

Please refer to FIG. 8 and FIG. 9, which shows another manufacturing process for manufacturing the inductor based on a T-core.

As shown in FIG. 8, the steps of manufacturing the inductor based on a T-core comprises: providing a T-core 11 having a pillar 12 (step S81); winding a conductive wire 60, such as a spiral coil on the pillar 12 (step S82); bending each of the two terminal parts 61, 62 of the conductive wire 60 onto the bottom surface of the T-core 11 (step S83), wherein the shape of the conductive wire 60 can be round, flat, or other suitable shape; placing the conductor wire 60 and the T-core 11 in a molding device, then filling magnetic powder material into the molding device, and then applying a hot pressing process on the magnetic powder material encapsulating the conductor wire 60 and the T-core 11 to form the main body 10 (step S84), wherein each of the two terminal parts 61, 62 of the conductive wire 60 is bent onto a recess 131 on the bottom surface 13 of the main body 10; coating a protective layer 40 on the outer surfaces of the main body 10 (step S85); removing off a portion of the main body 10 together with a portion of the ending part of the conductor wire 60 to expose the first axial surface 611 of the first ending part 61 of the wire conductor 60 and the second axial surface 621 of the second ending part 62 of the wire conductor 60, wherein the cutting line is along the line L2, as shown in FIG. 9 (step S86), wherein the ratio of the winding space of the coil relative to the size of the magnetic body can be increased; forming a first metal layer 33 by electroplating or a PVD process (step S87), wherein be first metal layer 33 can be made of Cu, Ag or other suitable metal or alloy; forming the conductive adhesive layer 34 such as Ag glue (step S88); forming a second metal layer 36 by electroplating process (step S89).

Figure 10:
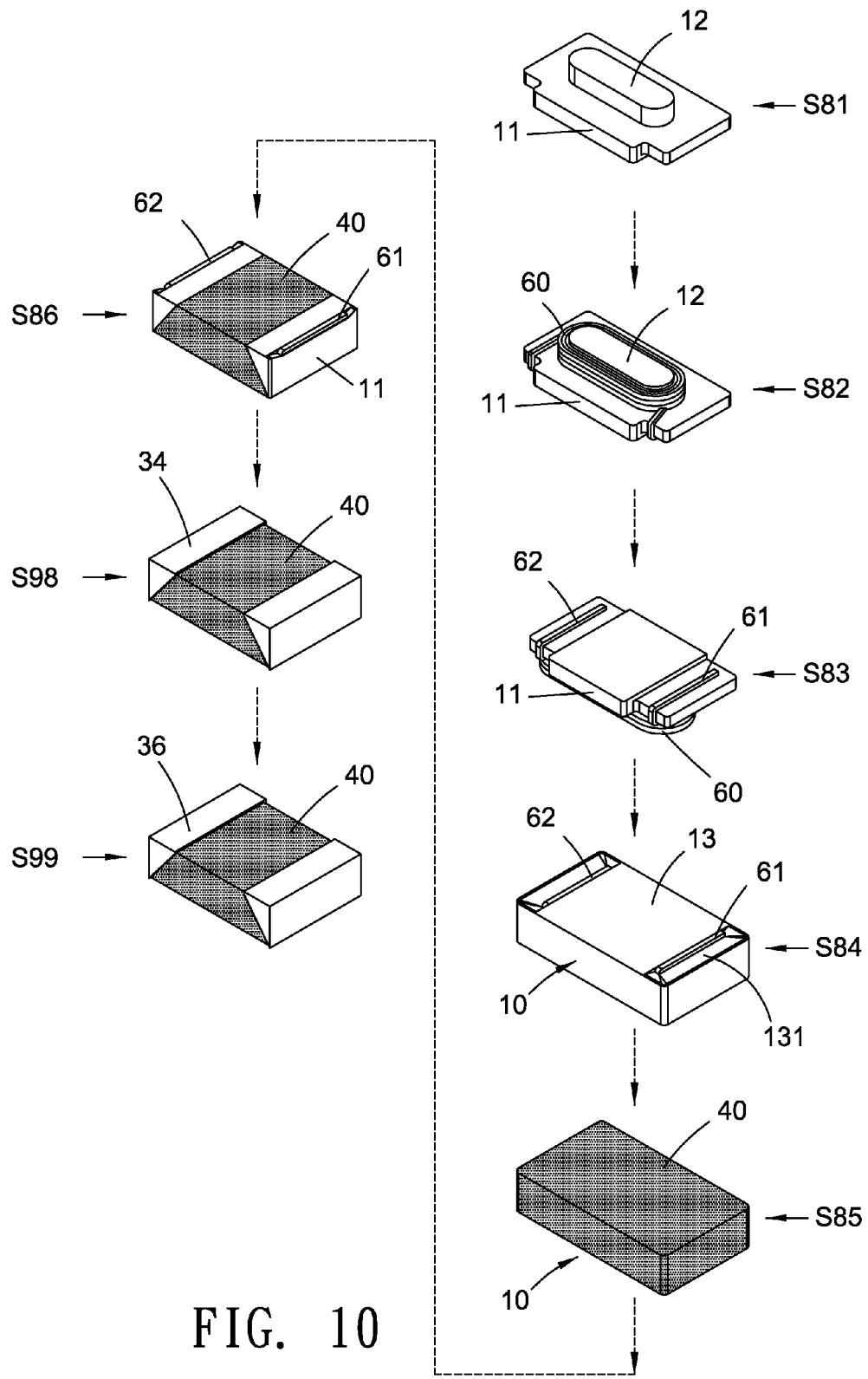
FIG. 10 illustrate a manufacturing process to make the electrical component according to another embodiment of the present invention.

Please refer to FIG. 10 which shows another manufacturing process for manufacturing the inductor, wherein the steps of S81~S86 are the same as described above for FIG. 8 and the differences between the FIG. 8 and FIG. 10 lies in the electrode structure.

The electrode structure in FIG. 10 is the same as the electrode structure shown in S76 of the FIG. 7, wherein the electrode structure comprises the conductive adhesive layer 34 and the second metal layer 36, wherein the second metal layer 36 overlays on the main body 10 to cover the conductive adhesive layer 34 and a portion of the protective layer 40 and electrically connects with the first axial surface 611 of the first end 61 of the conductor wire 60 and the second axial surface 621 of the second end 62 of the conductor wire 60, respectively. The steps S98 and S99 in FIG. 10 are described as following: forming the conductive adhesive layer 34 such as Ag glue (step S98); and forming a second metal layer 36 by electroplating process (step S99).

In one embodiment, the length of the pillar of the T-core is relatively short for better shielding and high density for increasing the permeability of the choke. The coil can be formed by enameled wire, and the insulating material of the enameled wire encapsulating the internal conductor can be removed by laser. The shape of the enameled wire can be round or flat or other suitable shape. However, the DCR of the flat wire is less than that of the round wire. In one embodiment, the round or flat wire can surround the pillar of the T-core by a machine automatically.

The electrodes of this invention are formed without having a lead frame in the final product, so that the choke can be made smaller and thinner.

Furthermore, the terminal parts of the coil are placed outside of the areas for winding the coil to increase the winding space. The terminal parts of the coil can be embedded in a recess on the top surface of the magnetic body. In addition, the T-core can have recesses on the corners for passing the terminal parts, so that the terminal parts of the coil can be fixed firmly. By doing so, there is no soldering required inside the magnetic body for connecting the terminal parts of the coil of the choke to the outside electrodes at all.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. An electrical component, comprising:
   a body;
   a conductive element disposed in the body, wherein at least one portion of a terminal part of the conductive element is exposed outside of the body;
   a metal foil having an adhesive material on the bottom surface thereof, the metal foil being adhered on the body through the adhesive material and covering a first portion of the terminal part of the conductive element, wherein a second portion of the terminal part of the conductive element is not covered by the metal foil; and
   a metal layer, overlaying on the metal foil and covering the second portion of the terminal part of the conductive element, wherein the metal layer is electrically connected to the second portion of the terminal part of the conductive element for electrically connecting with an external circuit.

2. The electrical component according to claim 1, wherein the electrical component is an inductor or a choke, wherein the body is a magnetic body and the conductive element is a conductive wire.

3. The electrical component according to claim 1, wherein the metal foil is coated with conductive adhesive material on the bottom surface thereof.

4. The electrical component according to claim 1, wherein the metal foil is a resin coated copper foil.

5. The electrical component according to claim 1, wherein the metal foil is made of Cu.

6. The electrical component according to claim 1, wherein the metal layer is made of Sn or Ni.

7. The electrical component according to claim 1, wherein the metal layer is made by electroplating.

8. The electrical component according to claim 1, wherein the metal foil is adhered on the first portion and a third portion of the terminal part of the conductive element, wherein the second portion is located between the first portion and the third portion.

9. The electrical component according to claim 1, wherein a third portion of the terminal part of the conductive element is not covered by the metal foil, wherein the first portion of the terminal part of the conductive element is located between the second portion and the third portion of the terminal part of the conductive element.

10. The electrical component according to claim 1, wherein a recess is formed on the top surface of the body, wherein the terminal part of the conductive element is disposed in the recess.

11. The electrical component according to claim 1, wherein the electrical component is an inductor and the conductive element is a coil, and the coil is disposed in the body with the terminal part of the coil disposed in a recess on a surface of the body.

12. The electrical component according to claim 1, wherein the electrical component is an inductor and the conductive element is a coil, wherein the body is a magnetic body and the coil is disposed in the magnetic body with the terminal part of the coil disposed in a recess on the bottom surface of the body, wherein the magnetic body comprises a T-core having a pillar, wherein the coil surrounds the pillar and the terminal part of the coil disposed in the recess on the bottom surface of the magnetic body via a side surface of the T-core.

* * * * *